US008779868B2

(12) United States Patent
White

(10) Patent No.: US 8,779,868 B2
(45) Date of Patent: Jul. 15, 2014

(54) MOBILE WIRELESS COMMUNICATIONS DEVICE WITH ADJUSTABLE IMPEDANCE MATCHING NETWORK AND ASSOCIATED METHODS

(75) Inventor: Mark D. White, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 638 days.

(21) Appl. No.: 13/045,179

(22) Filed: Mar. 10, 2011

(65) Prior Publication Data

US 2012/0229228 A1   Sep. 13, 2012

(51) Int. Cl.
  *H03H 7/38* (2006.01)
  *H04B 1/04* (2006.01)
(52) U.S. Cl.
  CPC .............. *H04B 1/0458* (2013.01); *H03H 7/38* (2013.01)
  USPC ............................................ 333/17.3; 333/32
(58) Field of Classification Search
  USPC ................................................... 333/17.3, 32
  See application file for complete search history.

(56) References Cited

U.S. PATENT DOCUMENTS

| | | | |
|---|---|---|---|
| 5,206,600 A | 4/1993 | Moehlmann | 324/650 |
| 5,386,194 A | 1/1995 | Moehlmann | 324/650 |
| 6,992,543 B2 * | 1/2006 | Luetzelschwab et al. | 333/32 |
| 7,586,384 B2 * | 9/2009 | Ranta | 333/17.3 |
| 2008/0266021 A1 | 10/2008 | Van Bezooijen et al. | 333/32 |
| 2009/0167457 A1 | 7/2009 | Melde et al. | 333/32 |
| 2009/0253385 A1 | 10/2009 | Dent et al. | 455/83 |
| 2010/0029226 A1 | 2/2010 | Visser | 455/115.1 |
| 2010/0182216 A1 | 7/2010 | Schmidhammer | |
| 2010/0225399 A1 | 9/2010 | Maruhashi et al. | 330/277 |
| 2010/0265003 A1 | 10/2010 | Schmidhammer | |

OTHER PUBLICATIONS

Firrao et al., "An automatic antenna tuning system using only RF signal amplitudes", IEEE, vol. 55, No. 9, Sep. 2008, pp. 833-837.
Van Bezooijen et al., "Adaptive impedance-matching techniques for controlling L networks", IEEE, vo. 57, No. 2, Feb. 2010, pp. 495-505.

* cited by examiner

*Primary Examiner* — Stephen Jones
(74) *Attorney, Agent, or Firm* — Allen, Dyer, Doppelt, Milbrath & Gilchrist, P.A.

(57) ABSTRACT

A mobile device includes an adjustable impedance matching network coupled between a power amplifier and an antenna and has an adjustable impedance element. An impedance sensor is coupled between the power amplifier and adjustable impedance matching network. A processor is configured to a) calculate a corrected antenna load impedance based upon a sensed impedance at inputs of the impedance matching network and a current value of the adjustable impedance element, and b) determine a new value for the adjustable impedance element based upon the corrected antenna load impedance. The processor is also configured to c) set the adjustable impedance element to the new value, and d) sense a new impedance at the inputs and determine if the sensed new impedance is within a threshold value of the power amplifier impedance, and repeat steps a), b), and c) if the sensed new impedance is not within the threshold value.

15 Claims, 4 Drawing Sheets

MOBILE WIRELESS COMMUNICATIONS DEVICE WITH ADJUSTABLE IMPEDANCE MATCHING NETWORK AND ASSOCIATED METHODS

FIELD OF THE INVENTION

The present invention relates to the field of mobile wireless communications devices, and, more particularly, to mobile wireless communications devices with adjustable impedance matching networks and related methods.

BACKGROUND OF THE INVENTION

In the field of RF signal transmission, it is known that the output impedance of an RF signal source should match the input impedance of its load as closely as possible. The better the match, the greater the efficiency of the power transfer is between the source and the load. Theoretically, if the impedances are exactly matched, the load absorbs 100% of the signal transmitted from the source. On the other hand, when there is a difference between the load impedance and the impedance of the source, the load does not fully absorb the entire signal from the source and "reflects" a portion of the signal back toward the source.

In a conventional RF transmission system, a transmitter is connected to an antenna through a device normally referred to as a matching network, or antenna coupler. The function of the matching network is to transform the impedance of the antenna to the desired characteristic impedance of the transmitter.

If the elements of such a transmission system remained constant, the coupler could be fixed and would not need to be changed. However, in practice, there are many factors which vary the impedance of the various elements in the transmission system, and thus, the impedance of the antenna coupler may also be changed. For example, the characteristics of antennas may change over time as the antennas endure wear and tear.

In addition, in mobile RF transmission systems, the characteristic impedance of an antenna may vary considerably with changes in the natural surroundings of the antenna. Further, the impedance of the antenna and other elements in a transmission system may be dependent upon the frequency of the signal being transmitted. Thus, mobile frequency hopping transmission systems encounter many changes in the characteristic impedance of the elements of the system for which it may be helpful to change the operation of the matching network between the transmitter and its associated antenna.

Conventional systems use differing techniques to identify when the matching network should be changed, and to identify what changes needed to be made. For example, it is known to measure the Voltage Standing Wave Ratio ("VSWR") of a transmitting system. If the VSWR exceeded a predetermined threshold, such as 2.5, the elements of the coupler could be altered to reduce the VSWR. Because the VSWR measures the ratio between the forward and reflected signals, it is considered a measure of the relative "goodness" of the impedance matching, a high VSWR indicating a relatively poor match and, accordingly, a relatively high reflected signal. A high VSWR therefore wastes power in a portable device and reduces the radiated signal magnitude.

Exemplary advances in devices to measure the impedance of a load, which are helpful in communications devices including matching networks, have been made. For example, U.S. Pat. Nos. 5,386,194 and 5,206,600 to Moehlmann, assigned to the same assignee as the present invention, disclose an impedance detector that samples the voltage and the current of a signal passing through a transmission line, and derives the impedance parameters independently of the amplitude or phase of the signal.

U.S. Pat. Pub. 2008/0266021 to Van Bezooijen et al. discloses a communications device including a power amplifier coupled to an antenna via a matching network. An impedance detector is coupled to the input of the matching network. The impedance detector measures the impedance at the input of the matching network. A control unit is coupled to the impedance detector and compares the impedance at the input of the matching network with a reference value representing the nominal load line impedance, and adjusts the matching network accordingly.

The control unit of this system, however, may require many iterations in changes until the impedance is properly matched. Consequently, new mobile wireless communications devices employing new methods of matching antenna load impedances to amplifier impedances may be needed.

SUMMARY OF THE INVENTION

In view of the foregoing background, it is therefore an object of the present invention to provide a mobile wireless communications device with an efficient adjustable impedance matching network.

This and other objects, features, and advantages in accordance with the present invention are provided by a mobile wireless communications device that may comprise an antenna, and a power amplifier having an amplifier impedance. An adjustable impedance matching network may be coupled between the power amplifier and the antenna, and may comprise at least one adjustable impedance element. An impedance sensor may be coupled between the power amplifier and the adjustable impedance matching network. A processor may be coupled to the power amplifier, the adjustable impedance matching network and the impedance sensor.

The processor may be configured to a) calculate a corrected antenna load impedance based upon a sensed impedance at inputs of the impedance matching network and based upon at least one current value of the at least one adjustable impedance element, and b) determine at least one new value for the at least one adjustable impedance element based upon the corrected antenna load impedance. The processor may also be configured to c) set the at least one adjustable impedance element to the at least one new value, and d) sense a new impedance at the inputs of the adjustable matching network and determine if the sensed new impedance is within a threshold value of the power amplifier impedance, and repeat steps a), b), and c) if the sensed new impedance is not within the threshold value of the power amplifier impedance. This advantageously allows quick and accurate matching of impedances between the amplifier and the input to the adjustable tuning network, so as to achieve a low VSWR.

In some applications, the processor may be configured to set at least one current value of the at least one adjustable impedance element based upon an initial estimated antenna load impedance, prior to performing step a). The impedance sensor may sense the antenna load impedance based upon a phase of a current and a voltage at the inputs of the adjustable matching network, and a magnitude of the current and the voltage at the inputs of the matching network.

The at least one adjustable impedance element may comprise at least one adjustable capacitance and at least one adjustable inductance coupled thereto. In addition, the processor may be configured to determine the at least one new value for the at least one adjustable capacitance by calculating a capacitive reactance of the calculated input impedance such that a calculated new impedance at the inputs of the adjustable matching network matches the power amplifier impedance, and by calculating a capacitance for the at least one adjustable capacitance based upon the capacitive reactance.

In addition, the processor may determine the at least one new value for the at least one adjustable inductance by calculating an inductive reactance of the calculated input impedance such that a calculated new impedance at the inputs of the adjustable matching network matches the power amplifier impedance, and calculating an inductance for the at least one adjustable inductance based upon the inductive reactance. The at least one adjustable capacitance may comprise a binary weighted network of capacitors, and the at least one adjustable inductance may comprise a binary weighted network of inductors.

A method aspect is directed to a method of operating a mobile wireless communications device comprising an antenna having an antenna load impedance, a power amplifier having an amplifier impedance, an adjustable impedance matching network coupled between the power amplifier and the antenna and comprising at least one adjustable impedance element, an impedance sensor coupled between the power amplifier and the adjustable impedance matching network, and a processor coupled to the power amplifier, the adjustable impedance matching network and the impedance sensor. The method may include a) calculating a corrected antenna load impedance based upon a sensed impedance at inputs of the impedance matching network and based upon at least one current value of the at least one adjustable impedance element, using the processor, and b) determining at least one new value for the at least one adjustable impedance element based upon the corrected antenna load impedance, using the processor.

The method may also include c) setting the at least one adjustable impedance element to the at least one new value, and d) sensing a new impedance at the inputs of the adjustable matching network and determining if the sensed new impedance is within a threshold value of the power amplifier impedance, and repeating steps a), b), and c) if the sensed new impedance is not within the threshold value of the power amplifier impedance, using the impedance sensor.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
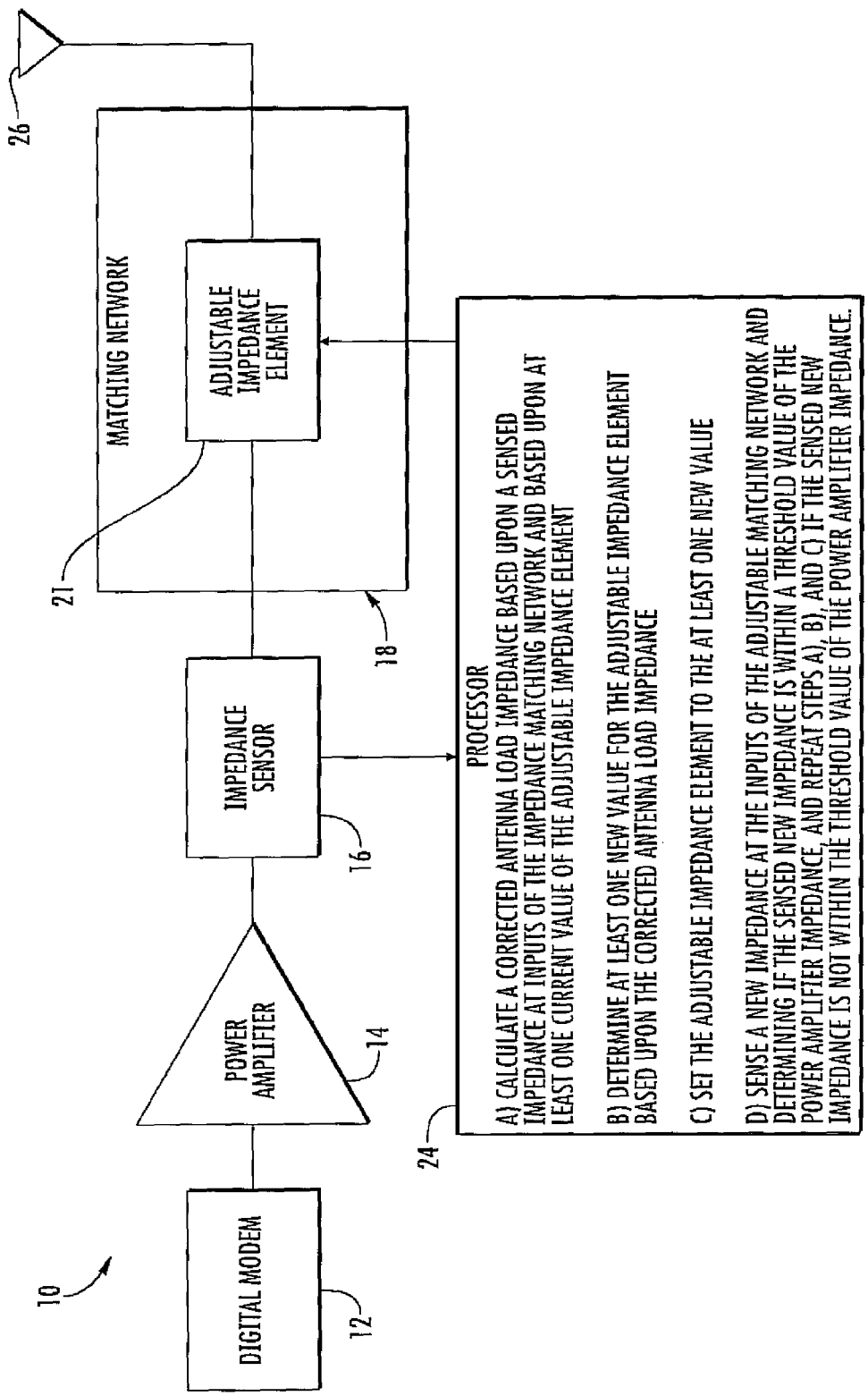
FIG. 1 is a schematic block diagram of a mobile wireless communications device in accordance with the present invention.

Referring initially to FIG. 1, a mobile wireless communications device 10 is now described. The mobile wireless communications device 10 includes a digital modem 12 coupled to a power amplifier 14 and cooperating therewith to generate and amplify a transmit signal. It should be appreciated that this transmit signal may be generated according to any digital modulation scheme, at any suitable frequency. In many applications, the mobile wireless communications device 10 would also include a receiver path, not shown, that may share some components or that may have its own components as would be appreciated by one of skill in the art.

The power amplifier 14 is coupled to the inputs of an adjustable impedance matching network 18 via an impedance sensor 16. The outputs of the adjustable matching network 18 are coupled to an antenna 26, such that the transmit signal is radiated via the antenna, and is adjustable so that the impedance of the antenna 26 may be matched to the output impedance of the power amplifier 14. Since the matching network 18 is coupled between the power amplifier 14 and the antenna 26, it is desirable for the impedance of the input to the matching network 18 to match the output of the power amplifier 14, which is typically 50Ω, so that the VSWR is as close to 1:1 as possible.

Figure 2:
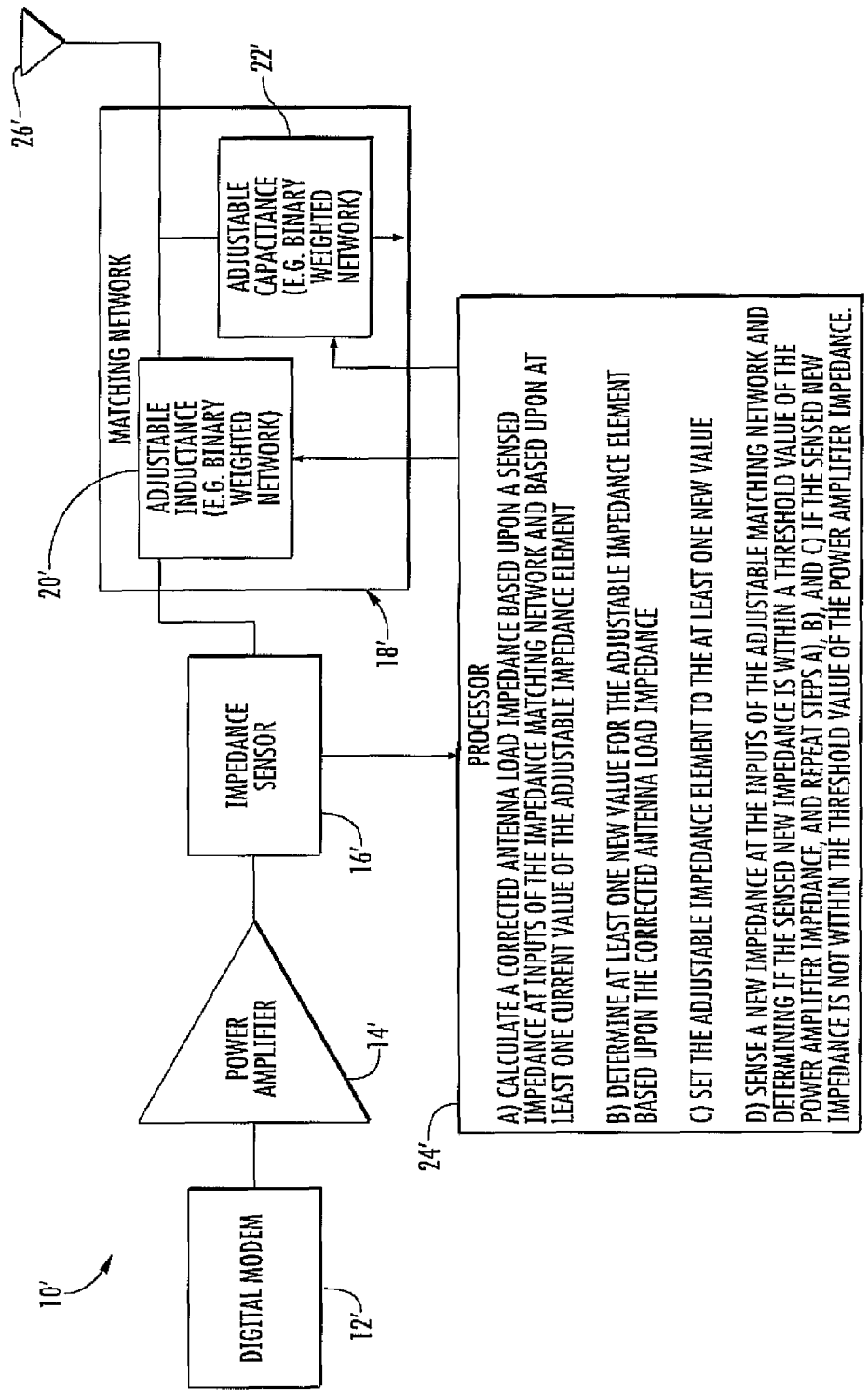
FIG. 2 is a flowchart of a method of operating the mobile wireless communications device as in FIG. 1.

The matching network includes an adjustable impedance element 21 coupled between the power amplifier 14 and the antenna 26. As shown in FIG. 2, the adjustable impedance element may be an adjustable inductance coupled between the power amplifier 14' and the antenna 26', and an adjustable capacitance 22' coupled between the antenna and ground. The adjustable inductance 20' and adjustable capacitance 22' may be binary weighted networks of inductors and capacitors, respectively, although it should be appreciated that any adjustable inductance and capacitance may be used. In addition, those of skill in the art will understand that any matching network 18' configuration may be used, and the matching network need not be limited to the illustrated configuration.

Referring again to FIG. 1, a processor 24 is coupled to the impedance sensor 16, adjustable inductance 20, and adjustable capacitance 22. The processor 24 is configured to calculate a corrected antenna load impedance based upon a sensed impedance at inputs of the impedance matching network 18 and based upon at least one current value of the adjustable impedance element 21.

The processor 24 is further configured to determine at least one new value for the adjustable impedance element 21 based upon the corrected antenna load impedance. The processor 24 then sets the adjustable impedance element 21 to the at least one new value. Thereafter, the processor 24 senses a new impedance at the inputs of the adjustable matching network 18 and determines if the sensed new impedance is within a threshold value of the power amplifier impedance. If the sensed new impedance is not within the threshold value, the processor 24 repeats the calculating, determining, setting, and sensing steps as described above.

The operation of the mobile wireless communications device 10 is now described in further detail. As will be appreciated by those of skill in the art, the current value of the adjustable impedance element 21 may be determined by initially setting the adjustable impedance element 21 to a corresponding value so that the impedance sensor 16 senses the antenna load impedance on the inputs of the adjustable impedance matching network 18 while operating the power amplifier 14. This initial value for the adjustable inductance 20 and adjustable capacitance 22 may be zero, such that the power amplifier 14 is coupled to the antenna 26 via the impedance sensor 16 as directly as possible and such that the influence of the matching network 18 on the transmit signal is minimized. Therefore, with the adjustable impedance element 21 set to zero, the input impedance to the matching network 18 as seen by the impedance sensor 16 will be a close estimate to the actual antenna load impedance. This impedance may be determined, for example, based upon a phase and a magnitude of a current and a voltage at the input of the matching network 18 as the power amplifier 14 is activated.

A current value for the adjustable impedance element 21 may be determined based upon the sensed antenna load impedance in an attempt to match a calculated new impedance at the inputs to the adjustable impedance matching network 18 to the power amplifier impedance. That is, the current value for the adjustable impedance element 21 is chosen such that the input impedance to the adjustable impedance matching network 18 is calculated to match the power amplifier impedance. Those skilled in the art will recognize that, due to component tolerances and theoretical limitations in the directivity of the impedance sensor employed, an actual resulting measured impedance may not match the calculated impedance.

One possible calculation of these values is now described with reference to FIG. 2, but it should be understood that these values may also be calculated in other ways. First, the processor 24' may calculate a capacitive reactance of the calculated new input impedance such that the calculated new impedance matches the power amplifier impedance. First, the series impedance Q factor for the matching network 18' is calculated by:

$$Q = \sqrt{\frac{RL}{RG} - 1 + \frac{XL^2}{RG*RL}}$$

where $R_L$ and $X_L$ are the real and reactive components (respectively) of the series equivalent of the antenna load impedance $Z_L$, and $R_G$ is the real component of the series equivalent of the desired input impedance $Z_G$ (here, the amplifier impedance). For simplification in the calculations that follow, $Z_G$ is assumed to be purely resistive, so $X_G$ is assumed to be zero and only $R_G$ is considered in the equations. This is consistent with typical (e.g. 50Ω) practical desired input impedances.

Next, the processor 24' may calculate the reactance $X_{CTUNE}$ of the tuning capacitance C in parallel with the antenna load impedance $Z_L$, as:

$$XCTUNE = \frac{XL - RL*Q}{\frac{RL}{RG} - 1}$$

The capacitance used to achieve $X_{CTUNE}$ is then calculated as:

$$C = \left\| \frac{10^6}{\omega * XCTUNE} \right\|$$

where C is the capacitance to which the adjustable capacitance 22' will be set, and ω=2*π*frequency, with the frequency being the frequency of the transmission signal.

Now that the new value for the adjustable capacitance 22' has been calculated, the processor 24' calculates the new value for the adjustable inductance 20' by first calculating the reactance $X_{LTUNE}$ of the calculated new input impedance such that the calculated new impedance matches the power amplifier impedance.

$$XLTUNE = -(XG - RG*Q) \quad (2)$$

The inductance used to achieve $X_{LTUNE}$ is then calculated as:

$$L = \frac{XLTUNE}{\omega}$$

where L is the inductance to which the adjustable inductance 22' will be set.

The processor 24' may then set the adjustable inductance 20' and adjustable capacitance 22' to the new calculated values. Using the impedance sensor 16', the processor 24' thereafter senses a new impedance at the inputs of the adjustable impedance matching network 18' while operating the power amplifier 14', and determines if this sensed new impedance is within a threshold value of the power amplifier impedance. If the sensed new impedance is in fact within the threshold value of the power amplifier impedance, then the antenna 26' has been properly matched to the power amplifier 14'.

If the sensed new impedance is not within the threshold value of the power amplifier impedance, then the processor 24' iteratively determines corresponding new values for the adjustable inductance 20' and adjustable capacitance 22', sets the adjustable inductance and adjustable capacitance to those new values, and measures the new impedance at the inputs of the adjustable impedance matching network 18'. When the new impedance is within the threshold value of the power amplifier impedance, the antenna 26' has been properly matched to the power amplifier 14'.

The determination of the new values for the adjustable inductance 20' and adjustable capacitance 22' is now described, although it should be understood that this is but one way to determine these new values, and that other ways are suitable as well First, the processor 24' calculates a corrected antenna load impedance based upon a sensed impedance at inputs of the impedance matching network 18' and the previously calculated values of the adjustable inductance 20' and adjustable capacitance 22'. This is calculated as:

$$ZL = (RL, XL) = \left( \frac{(RIN, XIN) - (0, XLTUNE)}{1 - \frac{(RIN, XIN) - (0, XLTUNE)}{(0, XCTUNE)}} \right)$$

where RIN and XIN are the real and reactive components of the new impedance measured at the input to the matching network 18'.

This new corrected load impedance is then used to calculate new values for the adjustable inductance 20' and adjustable capacitance 22', as explained above. The adjustable inductance 20' and adjustable capacitance 22' are then set to these new values, and the impedance on the input to the matching network 18' is measured via the impedance sensor 16' as the power amplifier 14' is activates. If this impedance is within the threshold value of the power amplifier impedance, then the antenna 26' has been properly matched to the power amplifier 14'.

If this impedance is still not within the threshold value, the above steps are iteratively performed until this input impedance is within the threshold value (e.g. a new value of the antenna load impedance is calculated based upon the new sensed impedance and the values of the adjustable inductance 20' and adjustable capacitance 22', new values of the adjustable inductance and capacitance are calculated based upon the new value of the antenna load impedance, the adjustable inductance and capacitance are set to the new values, and the input impedance is measured).

This mobile wireless communications device 10' and method of tuning the matching network 18' is particularly advantageous because the load impedance is re-calculated, as opposed to the prior art technique of trying to minimize the input error directly. This has the effect of including the typical sources of error in the new load impedance calculation and allows a simple ideal transformation equation to converge quickly. Indeed, even with significant initial measurement error, this improves tune convergence, and helps to minimize the number of iterations used for tuning. In addition, tight tuning network component tolerances are not as important to achieve an accurate tune, thereby reducing the cost of the mobile wireless communications device 10' as cheaper components can be used.

Figure 3:
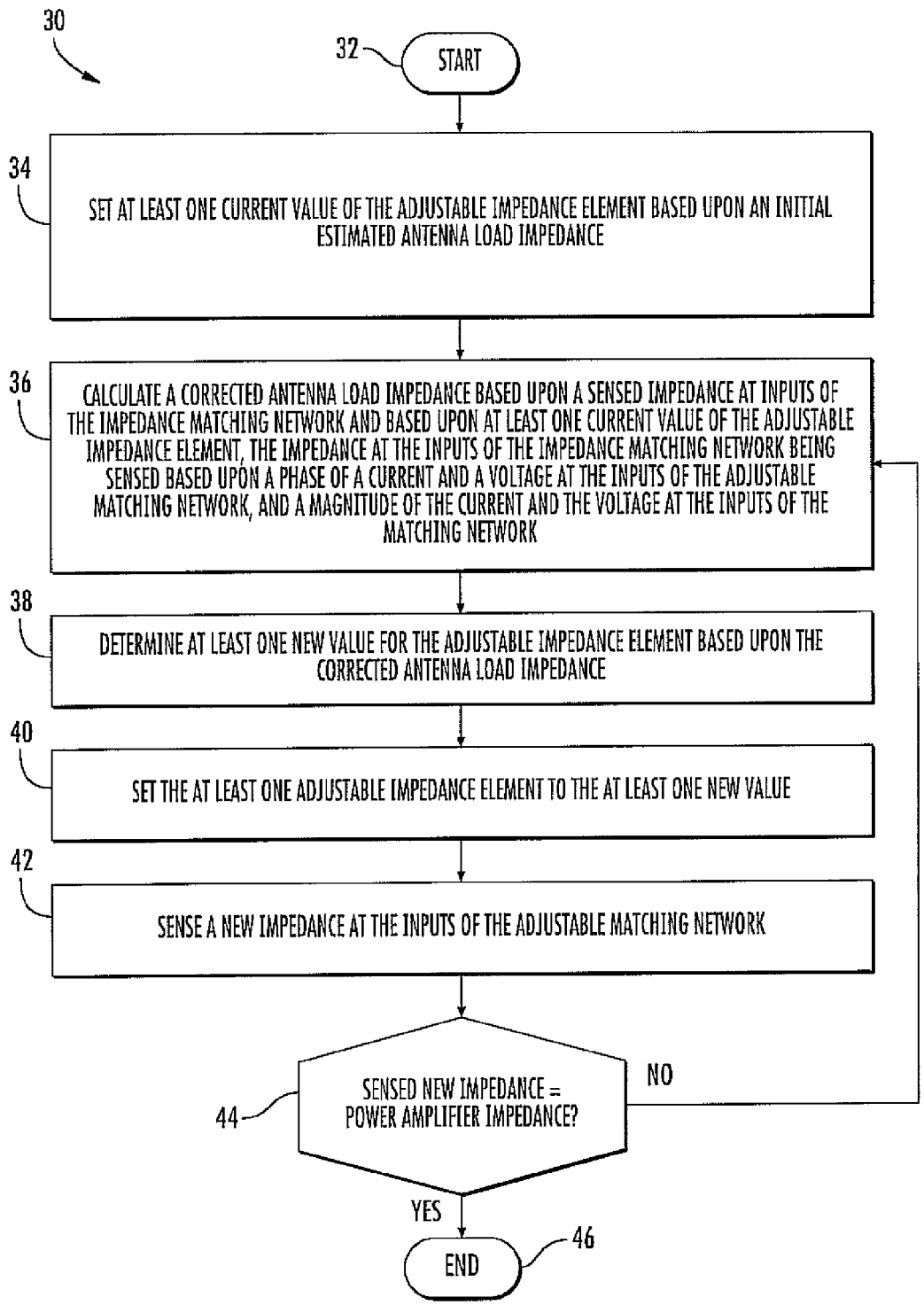
FIG. 3 is a portion of a flowchart detailing a method of iteratively determining corresponding new values for the at least one adjustable capacitance and the at least one adjustable inductance that may be performed while performing the method of the flowchart of FIG. 2.

With reference to the flowchart 30 of FIG. 3, a method of operating the mobile wireless communications device 10 detailed above is now further described. After the start 32, at least one current value of the adjustable impedance element is set based upon an initial estimated antenna load impedance (Block 34). Then, a corrected antenna load impedance is calculated based upon a sensed impedance at inputs of the impedance matching network and based upon at least one current value of the adjustable impedance element (Block 36). The impedance at the inputs of the impedance matching network is sensed based upon a phase of a current and a voltage at the inputs of the adjustable matching network, and a magnitude of the current and the voltage at the inputs of the matching network (also Block 36).

Thereafter, at least one new value for the adjustable impedance element is determined based upon the corrected antenna load impedance (Block 38). The at least one adjustable impedance element is then set to the at least one new value (Block 40). A new impedance is then sensed at the inputs of the adjustable matching network (Block 42). At Block 44, if the sensed new impedance is within a threshold of, or roughly equal to, the power amplifier impedance, then the method ends at Block 46. If the sensed new impedance is not within a threshold of, or roughly equal to, the power amplifier impedance, then the method reverts back to Block 36 and continues from there.

Figure 4:
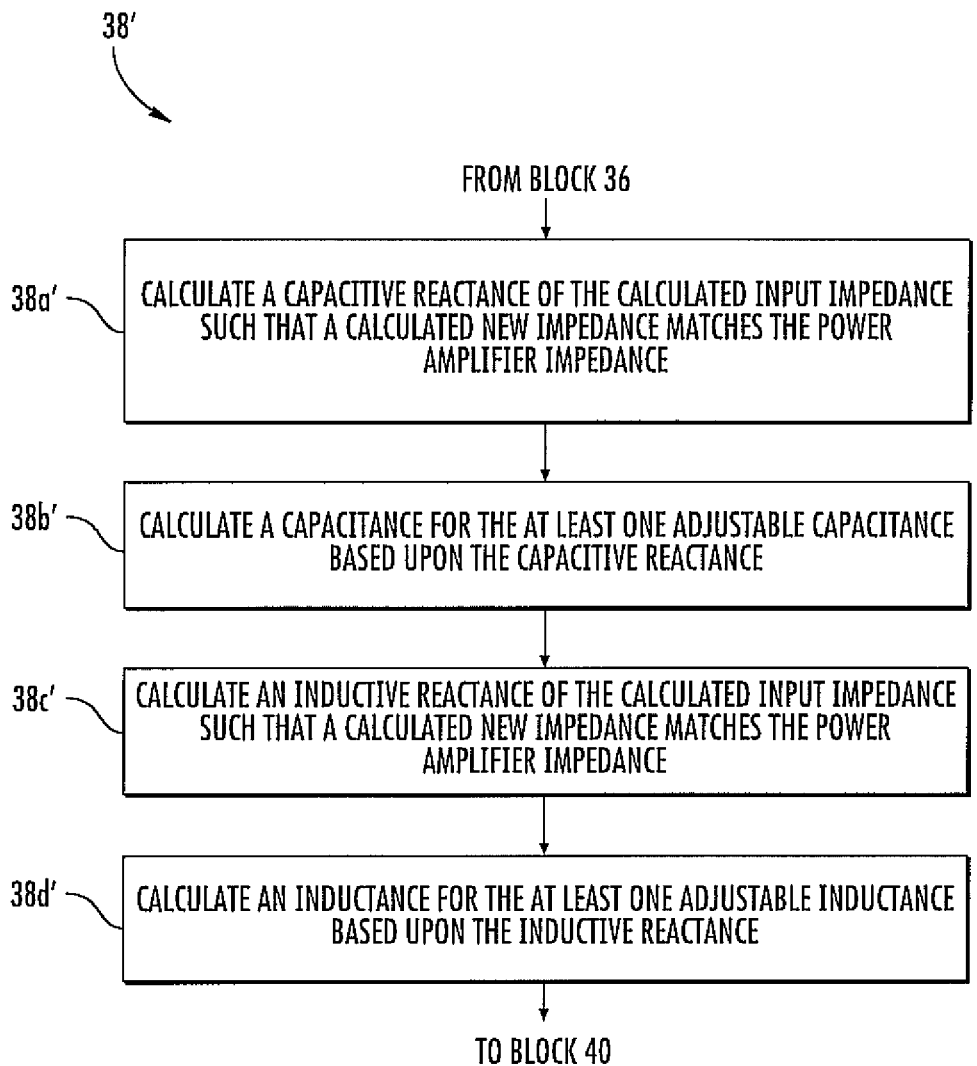
FIG. 4 is a portion of a flowchart detailing a method of determining corresponding new calculated values for the adjustable capacitance and inductance that may be performed while performing the method of the flowchart of FIG. 2.

With reference to the partial flowchart 38' of FIG. 4, one way of determining the new calculated values for the at least one adjustable impedance element, as per Block 36 of FIG. 3, is now described. Here, the at least one adjustable impedance element comprises at least one adjustable capacitance and at least one adjustable inductance. A capacitive reactance of the calculated input impedance is calculated such that the calculated new impedance matches the power amplifier impedance (Block 38a'). Then, a capacitance for the at least one adjustable capacitance is calculated based upon the capacitive reactance (Block 38b'). Next, an inductive reactance of the calculated input impedance is calculated such that the calculated new impedance matches the power amplifier impedance (Block 38c'), and an inductance for the at least one adjustable inductance is calculated based upon the inductive reactance (Block 38d').

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A mobile wireless communications device comprising:
an antenna;
a power amplifier having an amplifier impedance;
an adjustable impedance matching network coupled between said power amplifier and said antenna and comprising at least one adjustable impedance element;
an impedance sensor coupled between said power amplifier and said adjustable impedance matching network;
a processor coupled to said power amplifier, said adjustable impedance matching network and said impedance sensor, said processor configured to
 a) calculate a corrected antenna load impedance based upon a sensed impedance at inputs of said impedance matching network and based upon at least one current value of said at least one adjustable impedance element,
 b) determine at least one new value for said at least one adjustable impedance element based upon the corrected antenna load impedance,
 c) set said at least one adjustable impedance element to the at least one new value, and
 d) sense a new impedance at the inputs of said adjustable matching network and determining if the sensed new impedance is within a threshold value of the power amplifier impedance, and repeat steps a), b), and c) if the sensed new impedance is not within the threshold value of the power amplifier impedance.

2. The mobile wireless communications device of claim 1, wherein said processor is configured to set at least one current value of said at least one adjustable impedance element based upon an initial estimated antenna load impedance, prior to performing step a).

3. The mobile wireless communications device of claim 1, wherein said impedance sensor senses the antenna load impedance based upon a phase of a current and a voltage at the inputs of said adjustable matching network, and a magnitude of the current and the voltage at the inputs of said matching network.

4. The mobile wireless communication device of claim 1, wherein said at least one adjustable impedance element comprises at least one adjustable capacitance and at least one adjustable inductance coupled thereto.

5. The mobile wireless communications device of claim 4, wherein said processor is configured to determine the at least one new value for said at least one adjustable capacitance by:
calculating a capacitive reactance of the calculated input impedance such that a calculated new impedance at the inputs of the adjustable matching network matches the power amplifier impedance; and
calculating a capacitance for the at least one adjustable capacitance based upon the capacitive reactance.

6. The mobile wireless communications device of claim 4, wherein said processor determines the at least one new value for said at least one adjustable inductance by:

calculating an inductive reactance of the calculated input impedance such that a calculated new impedance at the inputs of the adjustable matching network to matches the power amplifier impedance; and calculating an inductance for the at least one adjustable capacitance based upon the inductive reactance.

7. The mobile wireless communications device of claim 4, wherein said at least one adjustable capacitance comprises a binary weighted network of capacitors.

8. The mobile wireless communications device of claim 4, wherein said at least one adjustable inductance comprises a binary weighted network of inductors.

9. A mobile wireless communications device comprising:
an antenna;
a power amplifier having an amplifier impedance;
an adjustable impedance matching network coupled between said power amplifier and said antenna and comprising at least one adjustable capacitance and at least one adjustable inductance;
an impedance sensor coupled between said power amplifier and said adjustable impedance matching network;
a processor coupled to said power amplifier, said adjustable impedance matching network and said impedance sensor, said processor configured to
a) set at least one current value of said at least one adjustable capacitance and at least one adjustable inductance based upon an initial estimated antenna load impedance,
b) calculate a corrected antenna load impedance based upon a sensed impedance at inputs of said impedance matching network and based upon at least one current value of said at least one adjustable capacitance and said at least one adjustable inductance,
c) determine at least one new value for said at least one adjustable capacitance and said at least one adjustable inductance based upon the corrected antenna load impedance,
d) set said at least one adjustable capacitance and at least one adjustable inductance to the at least one new values, and
d) sense a new impedance at the inputs of said adjustable matching network and determining if the sensed new impedance is within a threshold value of the power amplifier impedance, and repeat steps b), c), and d) if the sensed new impedance is not within the threshold value of the power amplifier impedance.

10. The mobile wireless communications device of claim 9, wherein said impedance sensor senses the antenna load impedance based upon a phase of a current and a voltage at the inputs of said adjustable matching network, and a magnitude of the current and the voltage at the inputs of said matching network.

11. The mobile wireless communication device of claim 9, wherein said at least one adjustable impedance element comprises at least one adjustable capacitance and at least one adjustable inductance coupled thereto.

12. The mobile wireless communications device of claim 11, wherein said processor is configured to determine the at least one new value for said at least one adjustable capacitance by:
calculating a capacitive reactance of the calculated input impedance such that a calculated new impedance at the inputs of the adjustable matching network matches the power amplifier impedance; and
calculating a capacitance for the at least one adjustable capacitance based upon the capacitive reactance.

13. The mobile wireless communications device of claim 11, wherein said processor determines the at least one new value for said at least one adjustable inductance by:
calculating an inductive reactance of the calculated input impedance such that a calculated new impedance at the inputs of the adjustable matching network to matches the power amplifier impedance; and
calculating an inductance for the at least one adjustable capacitance based upon the inductive reactance.

14. The mobile wireless communications device of claim 11, wherein said at least one adjustable capacitance comprises a binary weighted network of capacitors.

15. The mobile wireless communications device of claim 11, wherein said at least one adjustable inductance comprises a binary weighted network of inductors.

* * * * *